United States Patent
Nakatani et al.

(10) Patent No.: US 11,923,193 B2
(45) Date of Patent: Mar. 5, 2024

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kimihiko Nakatani, Toyama (JP); Motomu Degai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/185,320

(22) Filed: Feb. 25, 2021

(65) Prior Publication Data

US 2021/0272803 A1    Sep. 2, 2021

(30) Foreign Application Priority Data

Feb. 27, 2020    (JP) ................. 2020-032129

(51) Int. Cl.
*H01L 21/311*   (2006.01)
*H01L 21/02*    (2006.01)
*H01L 21/306*   (2006.01)

(52) U.S. Cl.
CPC .. *H01L 21/02312* (2013.01); *H01L 21/02126* (2013.01); *H01L 21/02211* (2013.01); *H01L 21/30604* (2013.01)

(58) Field of Classification Search
CPC .................. H01L 21/31116; H01L 21/3105
See application file for complete search history.

(56) References Cited

U.S. PATENT DOCUMENTS

| | | |
|---|---|---|
| 5,194,530 A | 3/1993 | Stevens et al. |
| 5,864,161 A | 1/1999 | Mitani et al. |
| 6,136,722 A | 10/2000 | Nambu |
| | (Continued) | |

FOREIGN PATENT DOCUMENTS

| | | |
|---|---|---|
| CN | 1214537 A | 4/1999 |
| CN | 101252087 A | 8/2008 |
| | (Continued) | |

OTHER PUBLICATIONS

WO2020016915.*

(Continued)

*Primary Examiner* — Thomas T Pham
(74) *Attorney, Agent, or Firm* — Volpe Koenig

(57) ABSTRACT

There is provided a technique that includes: (a) modifying a surface of a first base exposed on a surface of substrate by supplying modifying gas to the substrate including the first base and a second base exposed on the surface of the substrate; (b) selectively forming a first film on a surface of the second base by supplying first film-forming gas to the substrate after performing (a); (c) etching the first film formed on the surface of the first base to expose the surface of the first base and remodifying the surface of the first base by supplying first fluorine-containing gas to the substrate after the first film is formed on the surface of the first base after performing (b); and (d) selectively forming a second film on the first film formed on the surface of the second base by supplying second film-forming gas to the substrate after performing (c).

22 Claims, 8 Drawing Sheets

(56) References Cited

U.S. PATENT DOCUMENTS

| | | |
|---|---|---|
| 8,013,021 B2 | 9/2011 | MacQueen et al. |
| 9,793,107 B2 | 10/2017 | Noda et al. |
| 2005/0287728 A1 | 12/2005 | Arias |
| 2007/0281448 A1 | 12/2007 | Chen et al. |
| 2008/0213479 A1 | 9/2008 | Chou et al. |
| 2014/0287595 A1 | 9/2014 | Shimamoto et al. |
| 2014/0287596 A1 | 9/2014 | Hirose et al. |
| 2015/0072537 A1 | 3/2015 | Noda et al. |
| 2015/0332916 A1 | 11/2015 | Noda et al. |
| 2016/0225617 A1 | 8/2016 | Noda et al. |
| 2017/0278705 A1 | 9/2017 | Murakami et al. |
| 2017/0342553 A1 | 11/2017 | Yu et al. |
| 2018/0012752 A1 | 1/2018 | Tapily |
| 2018/0211833 A1* | 7/2018 | Li .................. C23C 16/4583 |
| 2018/0233349 A1 | 8/2018 | Smith et al. |
| 2018/0254179 A1 | 9/2018 | Chan et al. |
| 2018/0315840 A1 | 11/2018 | Chui et al. |
| 2019/0080904 A1 | 3/2019 | Anthis et al. |
| 2020/0140995 A1 | 5/2020 | Blanquart |
| 2021/0043448 A1 | 2/2021 | Li et al. |
| 2021/0074584 A1 | 3/2021 | Tapily |
| 2021/0098258 A1 | 4/2021 | Degai et al. |
| 2021/0143001 A1* | 5/2021 | Ashihara .......... C23C 16/0218 |
| 2021/0272803 A1 | 9/2021 | Nakatani et al. |
| 2021/0305043 A1 | 9/2021 | Nakatani et al. |

FOREIGN PATENT DOCUMENTS

| | | |
|---|---|---|
| CN | 101454877 A | 6/2009 |
| JP | 2013-243193 A | 12/2013 |
| JP | 2014-183218 A | 9/2014 |
| JP | 2015-053445 A | 3/2015 |
| JP | 2017-174919 A | 9/2017 |
| JP | 2017-222928 A | 12/2017 |
| JP | 2019-096877 A | 6/2019 |
| KR | 2015-0029517 A | 3/2015 |
| KR | 10-2019-0101508 A | 8/2019 |
| KR | 2019-0101508 A | 8/2019 |
| TW | 1540643 B | 7/2016 |
| WO | 2019/027738 A1 | 2/2019 |
| WO | 2019/071215 A1 | 4/2019 |
| WO | 2019/229785 A1 | 12/2019 |
| WO | 2020/016915 A1 | 1/2020 |

OTHER PUBLICATIONS

Taiwan Office Action dated Jan. 18, 2022 for Taiwan Patent Application No. 110101023.
Japanese Office Action dated Jan. 25, 2022 for Japanese Patent Application No. 2020-032129.
Singapore Search Report dated Feb. 16, 2022 for Singapore Patent Application No. 10202101966W.
Singapore Written Opinion dated Feb. 16, 2022 for Singapore Patent Application No. 10202101966W.
Korean Office Action dated Nov. 9, 2022 for Korean Patent Application No. 10-2021-0025526.
United States Office Action dated Feb. 16, 2023 for U.S. Appl. No. 17/132,608.
Ushakova Alexandra, et al., "Study of the Radical Chain Mechanism of Hydrocarbon Oxidation for In Situ Combustion Process". Journal of Combustion, vol. 2017, Article ID 2526596, p. 1-11.
Mameli, Alfredo, et al., Area-Selective Atomic Layer Deposition of SiO2 Acetylacetone as a Chemoselective Inhibitor in an ABC-Type Cycle. ACS Nano, Nov. 2017, 9303-9311.
Mackus, Adriaan J.M., et al., "From the Bottom-Up: Toward Area-Selective Atomic Layer Deposition with High Selectivity". Chemistry of Materials 2019, 31, 2-12.
Korean Office Action dated Nov. 9, 2022 for Korean Patent Application No. 10-2020-0182802.
Japanese Office Action dated Feb. 8, 2022 for Japanese Patent Application No. 2019-237905.
Singapore Written Opinion dated Aug. 30, 2022 for Singapore Patent Application No. 10202013019Q.
Singapore Search Report dated Nov. 1, 2021 for Singapore Patent Application No. 10202013019Q.
Singapore Written Opinion dated Nov. 1, 2021 for Singapore Patent Application No. 10202013019Q.
Taiwan Office Action dated Aug. 13, 2021 for Taiwan Patent Application No. 109141041.
Chinese Office Action dated Jul. 21, 2023 for Chinese Patent Application No. 202011596513.5.

* cited by examiner

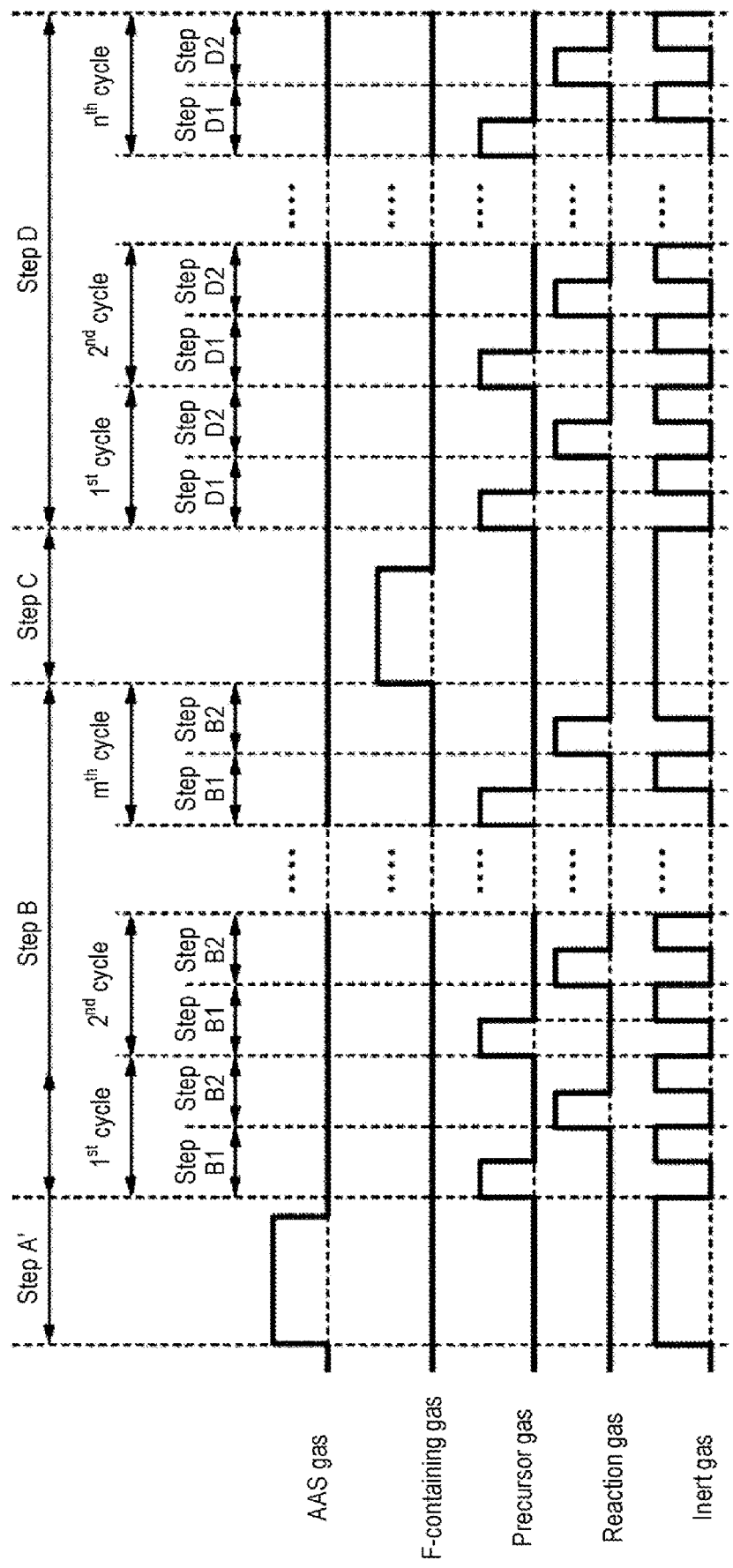

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2020-032129, filed on Feb. 27, 2020, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of selectively growing a film to be formed on a surface of a specific base among a plurality of types of bases exposed on a surface of a substrate (hereinafter, this process will be referred to as selective growth or selective film formation) is often carried out.

In the selective growth, before a film is selectively grown on a surface of a specific base, a process of modifying a surface of a base on which film growth is not intended may be performed to suppress the film growth.

However, in this case, when the selective growth is continuously performed for a predetermined period of time, selective breakage may occur, thereby causing the film to grow on the surface of the base on which the film growth is not intended. When the selective breakage occurs, the film may be etched to expose the surface of the base on which the film growth is not intended and then to remodify the surface of the base on which the film growth is not intended. As a result, a throughput may be lowered due to prolonged processing time, thus lowering throughput productivity.

SUMMARY

Some embodiments of the present disclosure provide a technique capable of improving a productivity in selective growth.

According to some embodiments of the present disclosure, there is provided a technique that includes: (a) modifying a surface of a first base exposed on a surface of a substrate by supplying a modifying gas to the substrate including the first base and a second base exposed on the surface of the substrate; (b) selectively forming a first film on a surface of the second base by supplying a first film-forming gas to the substrate after performing (a); (c) etching the first film formed on the surface of the first base to expose the surface of the first base and remodifying the surface of the first base by supplying a first fluorine-containing gas to the substrate after the first film is formed on the surface of the first base after performing (b); and (d) selectively forming a second film on the first film formed on the surface of the second base by supplying a second film-forming gas to the substrate after performing (c).

BRIEF DESCRIPTION OF DRAWINGS

The accompanying drawings, which are incorporated in and constitute a part of the specification, illustrate some embodiments of the present disclosure.

FIG. 6 is a diagram illustrating a processing sequence of selective growth according to some other embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Figure 1:
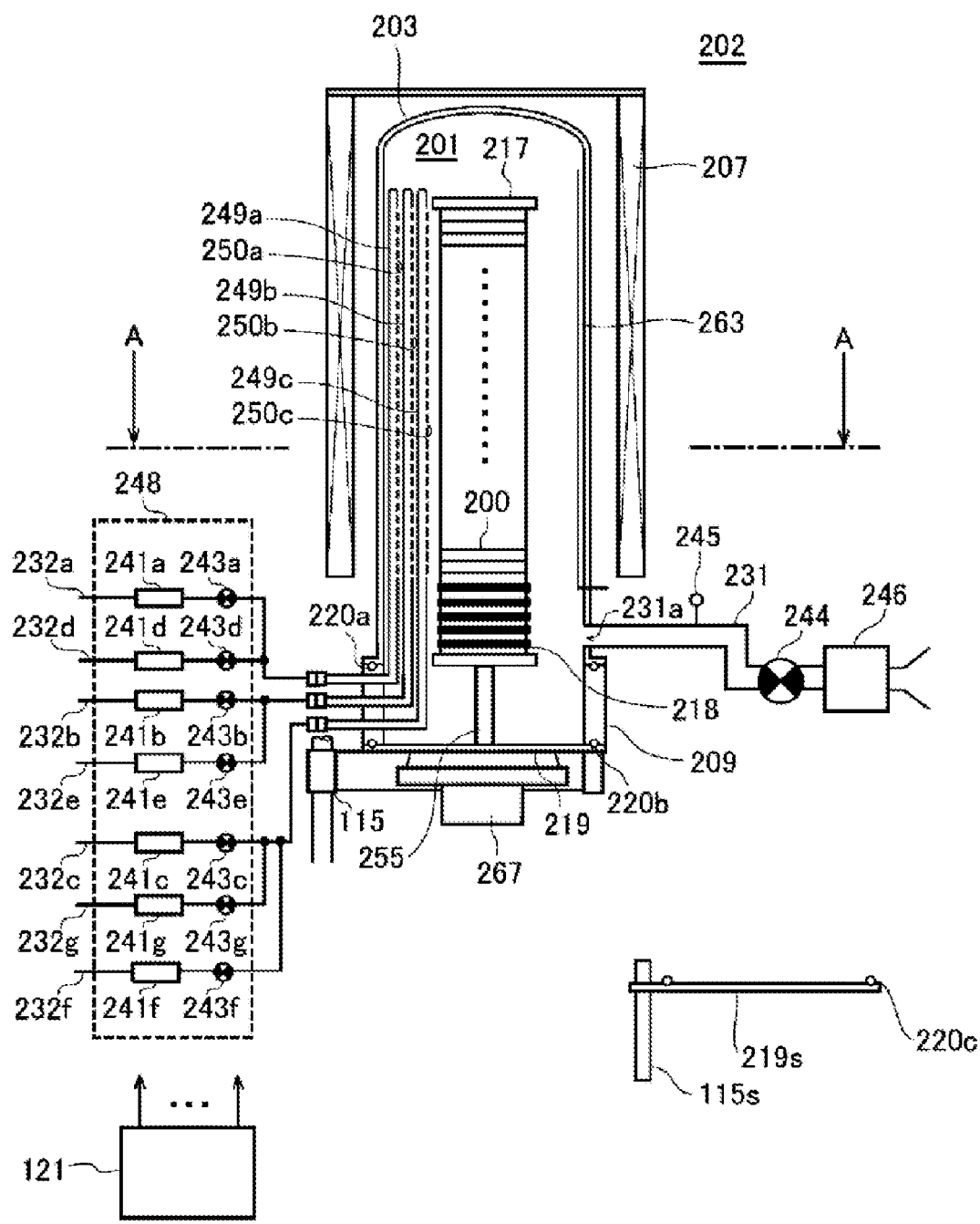
FIG. 1 is a schematic configuration diagram of a vertical type process furnace of a substrate processing apparatus suitably used in some embodiments of the present disclosure, in which a portion of the process furnace 202 is shown in a vertical cross sectional view.

Some embodiments of the present disclosure will now be described with reference to FIGS. 1 to 4 and 5A to 5I.
(1) Configuration of the Substrate Processing Apparatus As illustrated in FIG. 1, a process furnace 202 includes a heater 207 as a heating mechanism (temperature adjustment part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to accommodate wafers 200 as substrates. The processing of the wafers 200 is performed in the process chamber 201.

Nozzles 249a to 249c as first to third supply parts are installed in the process chamber 201 to penetrate a sidewall of the manifold 209. The nozzles 249a to 249c will also be referred to as first to third nozzles, respectively. The nozzles 249a to 249c are each made of a heat resistant material such as quartz or SiC. Gas supply pipes 232a to 232c are respectively connected to the nozzles 249a to 249c. The nozzles 249a to 249c are different nozzles, in which each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c sequentially from corresponding upstream sides of gas flow, respectively. Gas supply pipes 232d and 232e are respectively connected to the gas supply pipes 232a and 232b at the downstream side of the valves 243a and 243b. Gas supply pipes 232f and 232g are respectively connected to the gas supply pipe 232c at the downstream side of the valve 243c. MFCs 241d to 241g and valves 243d to 243g are installed at the gas supply pipes 232d to 232g sequentially from corresponding upstream sides of gas flow, respectively. The gas supply pipes 232a to 232g are made of a metal material such as, e.g., stainless steel (SUS) or the like.

Figure 2:
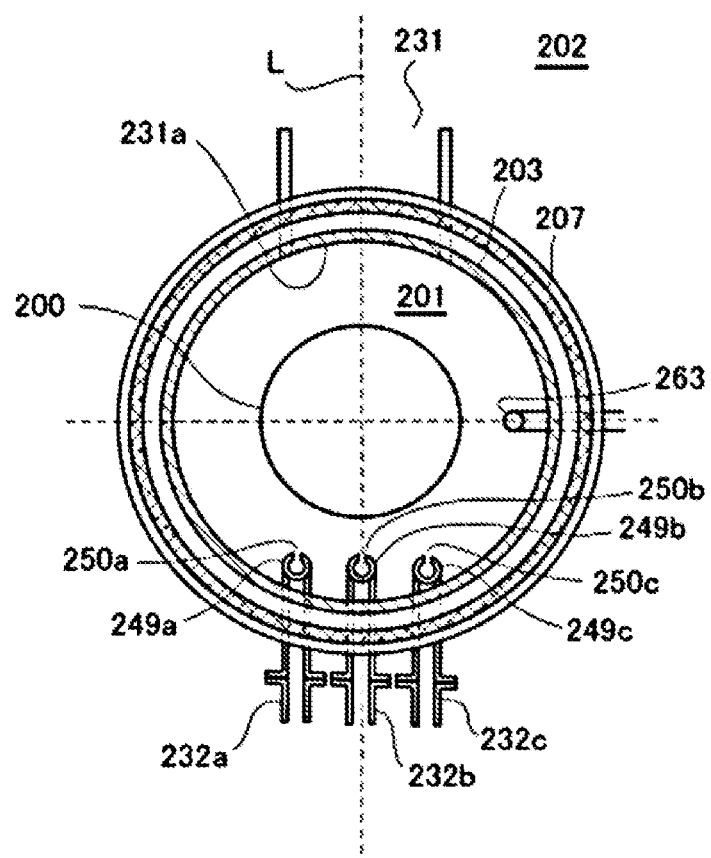
FIG. 2 is a schematic configuration diagram of the vertical type process furnace of the substrate processing apparatus suitably used in some embodiments of the present disclosure, in which a portion of the process furnace 202 is shown in a cross-sectional view taken along a line A-A in FIG. 1.

As illustrated in FIG. 2, the nozzles 249a to 249c are disposed in a space with an annular plan-view shape between the inner wall of the reaction tube 203 and the wafers 200 such that the nozzles 249a to 249c extend upward along an arrangement direction of the wafers 200 from a lower portion to an upper portion of the inner wall of the reaction tube 203. Specifically, the nozzles 249a to 249c are respectively installed at a lateral side of a wafer arrangement region in which the wafers 200 are arranged, namely in a region which horizontally surrounds the wafer arrangement region, to extend along the wafer arrangement region. The nozzle 249b is disposed to face an exhaust port 231a, which will be described later, on a straight line in a plane view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c configured to supply a gas are installed on the side surfaces of the nozzles 249a to 249c, respectively. The gas supply holes 250a to 250c are respectively opened to face the exhaust port 231a in the plane view, thus allowing a gas to be supplied toward the wafers 200. The gas supply holes 250a to 250c may be formed in a plural number between the lower portion and the upper portion of the reaction tube 203.

A gas, which contains silicon (Si) as a main element constituting a film to be formed on each of the wafers 200, as a precursor gas, that is, a halosilane-based gas which is a Si-containing gas, is supplied from the gas supply pipe 232a into the process chamber 201 via the MFC 241a, the valve 243a, and the nozzle 249a. The halosilane is a silane containing Si and a halogen element. The halosilane-based gas acts as a film-forming gas, that is, a Si source. The halogen element includes chlorine (Cl), fluorine (F), bromine (Br), iodine (I), and the like. As the halosilane-based gas, for example, a chlorosilane-based gas containing Si and Cl may be used.

A fluorine (F)-containing gas is supplied from the gas supply pipe 232b into the process chamber 201 via the MFC 241b, the valve 243b, and the nozzle 249b. The F-containing gas acts as a modifying gas or an etching gas.

A hydrogen nitride-based gas, which is a nitrogen (N)-containing gas, as a reaction gas, is supplied from the gas supply pipe 232c into the process chamber 201 via the MFC 241c, the valve 243c, and the nozzle 249c. The hydrogen nitride-based gas acts as a film-forming gas, that is, a N source (a nitriding gas or a nitriding agent).

An aminosilane-based gas (hereinafter, referred to as an "AS gas"), which is a gas containing Si and an amino group, as a Si-containing gas, is supplied from the gas supply pipe 232g into the process chamber 201 via the MFC 241g, the valve 243g, the gas supply pipe 232c, and the nozzle 249c. The Si-containing gas acts as a modifying gas.

An inert gas is supplied from the gas supply pipes 232d to 232f into the process chamber 201 via the MFCs 241d to 241f, the valves 243d to 243f, the gas supply pipes 232a to 232c, and the nozzles 249a to 249c, respectively. The inert gas acts as a purge gas, a carrier gas, a dilution gas, or the like.

A film-forming gas supply system (a precursor gas supply system or a reaction gas supply system) mainly includes the gas supply pipes 232a and 232c, the MFCs 241a and 241c, and the valves 243a and 243c. A Si-containing gas supply system (AS gas supply system) mainly includes the gas supply pipe 232g, the MFC 241g, and the valve 243g. A F-containing gas supply system mainly includes the gas supply pipe 232b, the MFC 241b, and the valve 243b. An inert gas supply system mainly includes the gas supply pipes 232d to 232f, the MFCs 241d to 241f, and the valves 243d to 243f. The Si-containing gas supply system and the F-containing gas supply system may be referred to as a modifying gas supply system.

One or all of various supply systems described above may be configured as an integrated supply system 248 in which the valves 243a to 243g, the MFCs 241a to 241g, and the like are integrated. The integrated supply system 248 is connected to each of the gas supply pipes 232a to 232g such that a supply operation of various types of gases into the gas supply pipes 232a to 232g (that is, an opening/closing operation of the valves 243a to 243g, a flow rate adjusting operation by the MFCs 241a to 241g or the like) is controlled by a controller 121 which will be described later. The integrated supply system 248 is configured as an integral type or division type integrated unit, and may be attached to or detached from the gas supply pipes 232a to 232g or the like on an integrated unit basis, such that maintenance, replacement, expansion or the like of the integrated supply system 248 may be performed on the integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be regulated by regulating an opening degree of the APC valve 244 based on pressure information detected by the pressure sensor 245 while operating the vacuum pump 246. An exhaust system mainly includes the exhaust pipe 231, the APC valve 244, and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up or down. A shutter 219s as a furnace opening lid capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel or the like, and is formed in a disc shape. An O-ring 220c as a seal member making contact with the lower end portion of the manifold 209 is installed on an upper surface of the shutter 219s. An opening/closing operation (an up-down movement operation, a rotational movement operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is regulated such that the interior of the process chamber 201 has a desired temperature distribution. The temperature sensor 263 is installed along the inner wall of the reaction tube 203.

Figure 3:
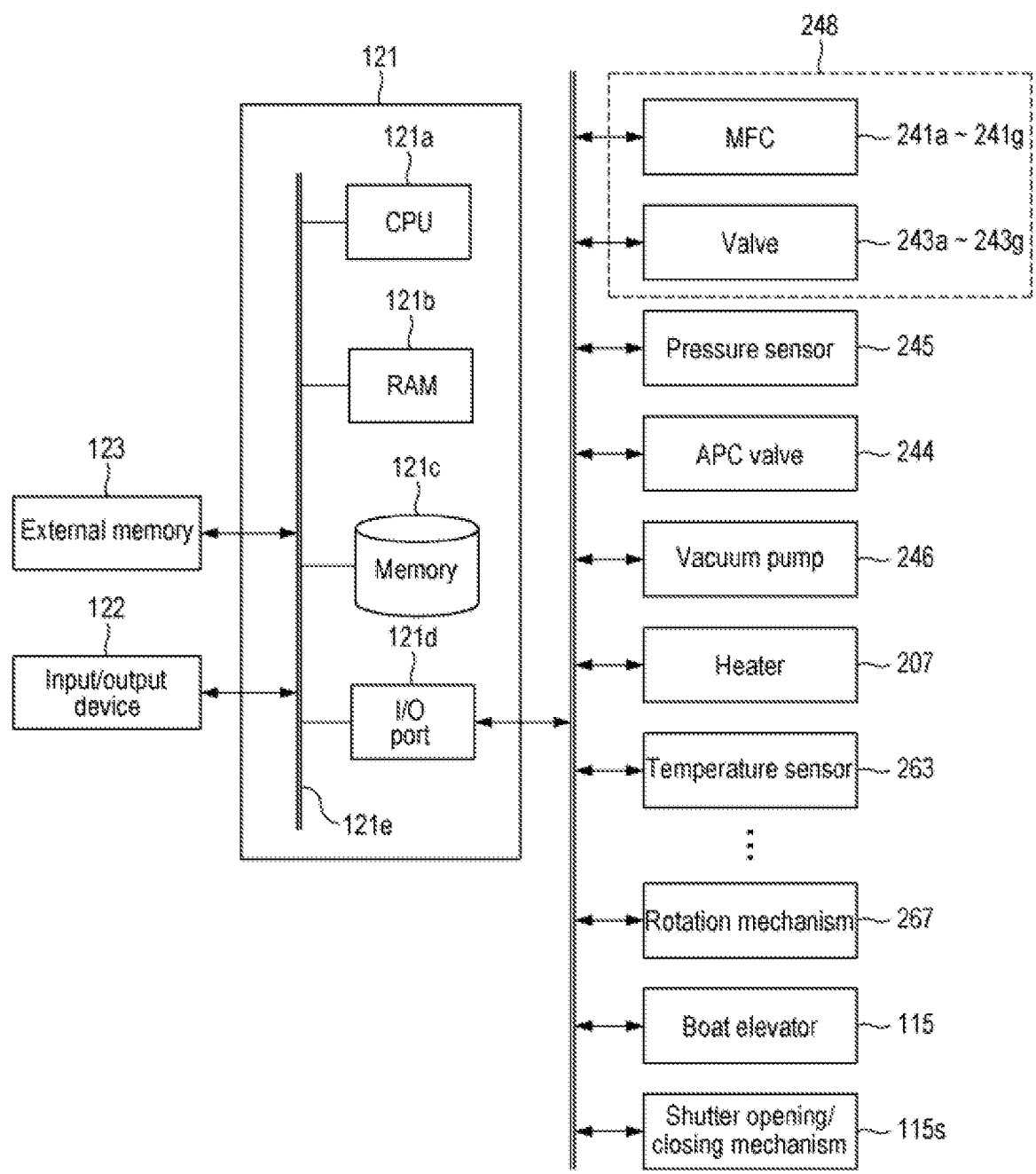
FIG. 3 is a schematic configuration diagram of a controller 121 of a substrate processing apparatus suitably used in some embodiments of the present disclosure, in which a control system of the controller 121 is shown in a block diagram.

As illustrated in FIG. 3, the controller 121, which is a control part (control means), may be configured as a computer including a central processing unit (CPU) 121a, a random access memory (RAM) 121b, a memory 121c, and an I/O port 121d. The RAM 121b, the memory 121c and the I/O port 121d are configured to be capable of exchanging data with the CPU 121a via an internal bus 121e. An input/output device 122 configured as, for example, a touch panel or the like, is connected to the controller 121.

The memory 121c includes, for example, a flash memory, a hard disk drive (HDD), a solid state drive (SSD), or the like. A control program that controls operations of a substrate processing apparatus, a process recipe in which sequences, conditions, and the like of substrate processing to be described below are described, and the like are readably stored in the memory 121c. The process recipe functions as a program configured to be capable of causing the controller 121 to execute each sequence in the substrate processing to be described below, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a are temporarily stored.

The I/O port 121d is connected to the MFCs 241a to 241g, the valves 243a to 243g, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory 121c and execute the same. The CPU 121a also reads the recipe from the memory 121c according to an input of an operation command from the input/output device 122. In addition, the CPU 121a is configured to control, according to the contents of the recipe thus read, the flow rate regulating operation of various types of gases by the MFCs 241a to 241g, the opening/closing operation of the valves 243a to 243g, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 and regulating the rotation speed of the boat 217 with the rotation mechanism 267, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory 123. The external memory 123 may include, for example, a magnetic disc such as a HDD, an optical disc such as a CD, a magneto-optical disc such as a MO, a semiconductor memory such as a USB memory, a SSD, and the like. The memory 121c or the external memory 123 is configured as a computer-readable recording medium. Hereinafter, the memory 121c and the external memory 123 will be generally and simply referred to as a "recording medium." When the term "recording medium" is used herein, it may indicate a case of including only the memory 121c, a case of including only the external memory 123, or a case of including both the memory 121c and the external memory 123. Furthermore, the program may be supplied to the computer by using a communication means such as the Internet or a dedicated line, instead of using the external memory 123.

(2) Substrate Processing

As a process of manufacturing a semiconductor device by using the above-described substrate processing apparatus, a processing sequence example of selective growth (selective film formation) selectively growing and forming a film on a surface of a specific base among a plurality of types of bases exposed on a surface of a wafer 200 as a substrate will be described with reference to FIGS. 1 to 4 and 5A to 5H. In the following descriptions, operations of respective parts constituting the substrate processing apparatus are controlled by the controller 121.

Figure 4:
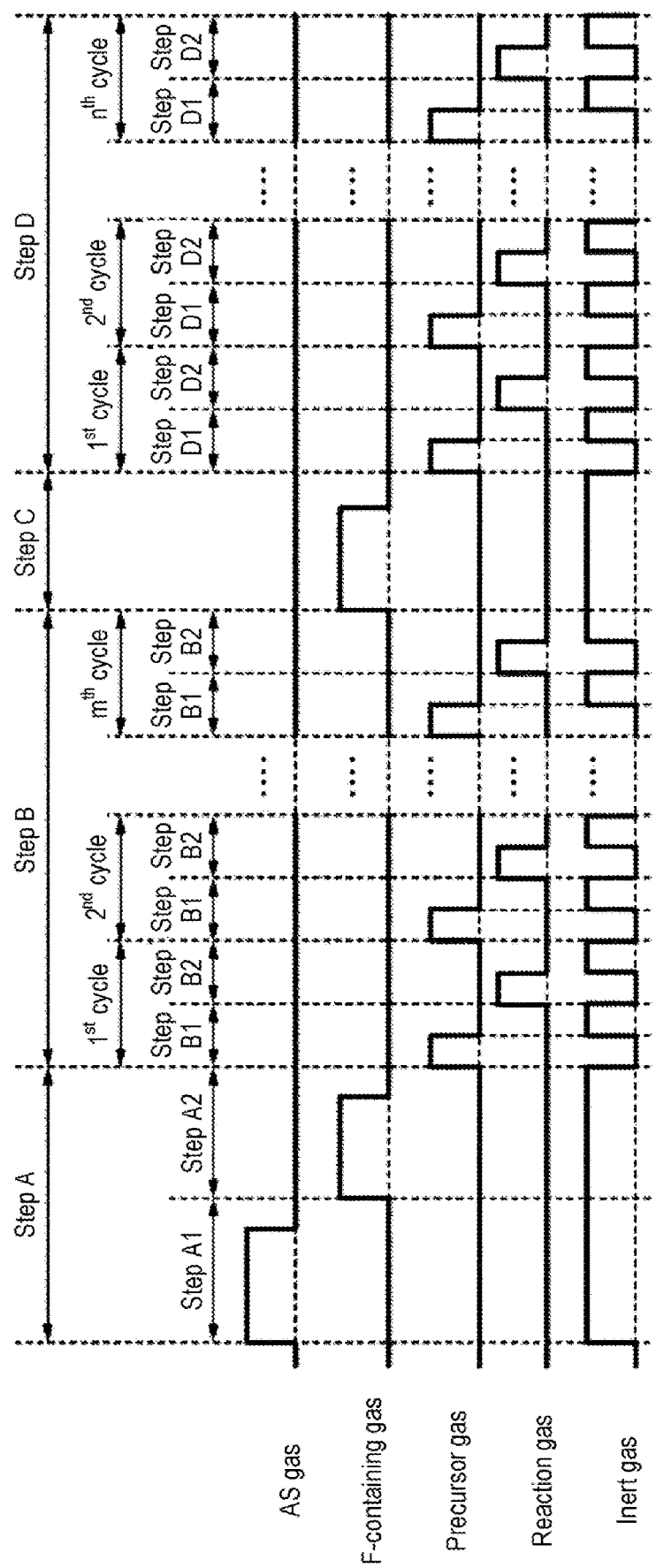
FIG. 4 is a diagram illustrating a processing sequence of selective growth according to some embodiments of the present disclosure.

In a processing sequence illustrated in FIG. 4, there are performed: (a) modifying a surface of a base 200a exposed on a surface of a wafer 200 by supplying an AS gas, which is a Si-containing gas, and a F-containing gas, as a modifying gas, to the wafer 200 including the base 200a as a first base and a base 200b as a second base exposed on the surface of the wafer 200 (step A); (b) selectively (that is, preferentially) forming a silicon nitride film (SiN film) as a first film on a surface of the base 200b by supplying a precursor gas and a reaction gas as a film-forming gas to the wafer 200 after performing (a) (step B); (c) etching the first film (SiN film) formed on the surface of the base 200a to expose the surface of the base 200a and remodifying the surface of the base 200a by supplying a F-containing gas to the wafer 200 after the first film (SiN film) is formed on the surface of the base 200a after performing (b) (step C); and (d) selectively forming a SiN film as a second film on the first film (SiN film) formed on the surface of the base 200b by supplying the precursor gas and the reaction gas as the film-forming gas to the wafer 200 after performing (c) (step D).

Further, in FIG. 4, an example where in (a), that is, step A, (a1) step A1 of supplying the AS gas to the wafer 200 and (a2) step A2 of supplying the F-containing gas to the wafer 200 are sequentially performed is illustrated.

In addition, in FIG. 4, an example where in (b), that is, step B, a cycle is performed a predetermined number of times (m times, where m is an integer of 1 or more), the cycle including non-simultaneously performing step B1 of supplying the precursor gas to the wafer 200 and step B2 of supplying the reaction gas to the wafer 200, is illustrated.

Further, in FIG. 4, an example where in (c), that is, step C, by supplying the F-containing gas to the wafer 200, etching of the first film (SiN film) formed on the surface of the base 200a and remodification of the surface of the base 200a are performed under the same processing conditions is illustrated.

Further, in FIG. 4, an example where in (d), that is, step D, a cycle is performed a predetermined number of times (n times, where n is an integer of 1 or more), the cycle including non-simultaneously performing step D1 of supplying a precursor gas to the wafer 200 and step D2 of supplying a reaction gas to the wafer 200, is illustrated.

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer". When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

When the boat 217 is charged with a plurality of wafers 200 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

Figure 5A:
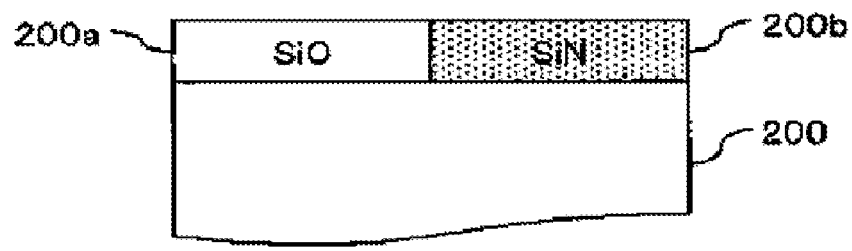
FIG. 5A is a partial enlarged cross-sectional view of a surface of a wafer 200 including a base 200a including a silicon oxide film and a base 200b including a silicon nitride film each exposed on a surface of the wafer 200.

As illustrated in FIG. 5A, a plurality of types of bases exist on a surface of a wafer 200. In the present disclosure, for example, the base 200a including the SiO film as an oxygen (O)-containing film (that is, an oxide film), and the base 200b including the SiN film as a nitride film, which is an O-free film (that is, a non-oxidizing film), are exposed in advance on the surface of the wafer 200. The base 200a has a surface terminated with a hydroxyl group (OH) over the entire area (entire surface). The base 200b has a surface not terminated with OH in many areas, that is, a surface terminated with OH in some areas.

(Pressure Regulation and Temperature Regulation)

After the loading of the boat 217 into the process chamber 201 is completed, the interior of the process chamber 201, that is, a space where the wafers 200 are placed, is vacuum-exhausted (decompression-exhausted) by the vacuum pump 246 to reach a desired pressure (vacuum degree). In this operation, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired processing temperature. In this operation, a degree of supplying electric power to the heater 207 is feedback-controlled based on the temperature information detected by the temperature sensor 263 such that the interior of the process chamber 201 has a desired temperature distribution. Further, rotation of the wafers 200 by the rotation mechanism 267 begins. The exhaust of the interior of the process chamber 201 and the heating and rotation of the wafers 200 are continuously performed at least until the processing on the wafers 200 is completed.

(Selective Growth)

Subsequently, the following steps A to D are sequentially performed.

[Step A]

At this step, the surface of the base 200*a* is modified by supplying the AS gas and the F-containing gas as a modifying gas in this order to the wafer 200 including the base 200*a* and the base 200*b* exposed on the surface of the wafer 200. At step A, step A1 of supplying the AS gas to the wafer 200 and step A2 of supplying the F-containing gas to the wafer 200 are performed in this order. Hereinafter, steps A1 and A2 will be described in detail.

[Step A1]

At step A1, Si contained in the AS gas is adsorbed on the surface of the wafer 200*a* by supplying the AS gas as the Si-containing gas to the wafer 200 in the process chamber 201, that is, the wafer 200 including the base 200*a* and the base 200*b* exposed on the surface of the wafer 200.

After the pressure regulation and the temperature regulation in the process chamber 201 are completed, the AS gas is supplied to the wafer 200 in the process chamber 201, that is, the wafer 200 including the base 200*a* and the base 200*b* exposed on the surface of the wafer 200.

Specifically, the valve 243*g* is opened to allow the AS gas to flow through the gas supply pipe 232*g*. A flow rate of the AS gas is regulated by the MFC 241*g*. The AS gas is supplied into the process chamber 201 via the gas supply pipe 232*c* and the nozzle 249*c* and is exhausted from the exhaust port 231*a*. At this time, the AS gas is supplied to the wafer 200 (AS gas supply). Simultaneously, the valves 243*d* and 243*e* are opened to supply an inert gas into the process chamber 201 via the nozzles 249*a* and 249*b* respectively. The supply of the inert gas may not be performed.

Processing conditions at this step may be exemplified as follows:

AS gas supply flow rate: 1 to 2,000 sccm, specifically 1 to 500 sccm in some embodiments As gas supply time: 1 second to 60 minutes Inert gas supply flow rate (per gas supply pipe): 0 to 10,000 sccm Processing temperature: room temperature (25 degrees C.) to 600 degrees C., specifically room temperature to 450 degrees C. in some embodiments Processing pressure: 1 to 2,000 Pa, specifically 1 to 1,000 Pa in some embodiments.

The conditions described herein are conditions under which the AS gas is not gas-phase decomposed (pyrolyzed) in the process chamber 201.

Further, in the present disclosure, an expression of a numerical range such as "1 to 2,000 Pa" may mean that a lower limit value and an upper limit value are included in that range. Therefore, for example, "1 to 2,000 Pa" may mean "1 Pa or higher and 2,000 Pa or lower". The same applies to other numerical ranges.

Figure 5B:
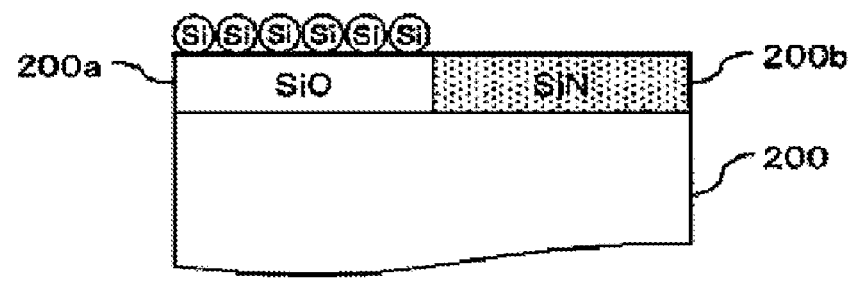
FIG. 5B is a partial enlarged cross-sectional view of the surface of the wafer 200 after silicon is selectively adsorbed on a surface of the base 200a by supplying an aminosilane-based gas.

By supplying the AS gas to the wafer 200 under the aforementioned conditions, as illustrated in FIG. 5B, Si contained in the AS gas may be selectively (that is, preferentially) adsorbed on the surface of the base 200*a* while suppressing Si contained in the AS gas from being adsorbed on the surface of the base 200*b*. At this time, Si contained in the AS gas may be adsorbed on a portion of the surface of the base 200*b*, but an adsorption amount of Si becomes smaller than an adsorption amount of Si on the surface of the base 200*a*. Such selective (that is, preferential) adsorption is possible because the processing conditions at this step are set to the conditions under which the AS gas is not gas-phase decomposed in the process chamber 201. Further, the selective adsorption is possible because the surface of the base 200*a* is OH-terminated over the entire region, whereas many regions of the surface of the base 200*b* are not OH-terminated (some regions of the surface are OH-terminated). At this step, since the AS gas is not gas-phase decomposed in the process chamber 201, Si contained in the AS gas is not multiple-deposited on the surfaces of the bases 200*a* and 200*b*. At this step, on the surface of the base 200*a*, the OH termination formed on the entire region of the surface reacts with the AS gas to cause Si contained in the AS gas to be chemisorbed on the entire region of the surface of the base 200*a*. On the other hand, since the OH termination does not exist in many regions of the surface of the base 200*b*, Si contained in the AS gas is not chemisorbed in those many regions. However, the OH termination formed in some regions of the surface of the base 200*b* and the AS gas may react with each other to cause Si contained in the AS gas to be chemisorbed on the regions.

Further, when the supply of the AS gas is continued for a predetermined period of time, the chemisorption of Si on the surface of the base 200*a* is saturated. That is, the chemisorption of Si on the surface of the base 200*a* is self-limited. In other words, when a Si layer having a saturation thickness is formed on the surface of the base 200*a*, Si is no longer chemisorbed on the surface of the base 200*a*. As a result, the amount of Si adsorbed on the surface of the base 200*a* becomes substantially uniform over the entire region of the surface of the base 200*a*.

After Si is selectively adsorbed on the surface of the base 200*a*, the valve 243*g* is closed to stop the supply of the AS gas into the process chamber 201. Then, the interior of the process chamber 201 is vacuum-exhausted and the gas or the like remaining within the process chamber 201 is removed from the interior of the process chamber 201. At this time, the valves 243*d* to 243*f* are opened to supply an inert gas into the process chamber 201 via the nozzles 249*a* to 249*c*. The inert gas supplied from the nozzles 249*a* to 249*c* acts as a purge gas. Thus, the interior of the process chamber 201 is purged (purge).

As the AS gas, it may be possible to use, for example, a monoaminosilane ($SiH_3(NR_2)$, abbreviation: MAS) gas which is a precursor containing one amino group in a composition formula (in one molecule).

In the present disclosure, R indicates a hydrogen atom or a hydrocarbon group, and $NR_2$ indicates an amino group in which one or two hydrocarbon groups containing one or more C atoms are coordinated to one N atom (in which one or both of H's of the amino group represented by $NH_2$ is substituted by a hydrocarbon group containing one or more C atoms). When two hydrocarbon groups constituting a portion of the amino group are coordinated to one N, the two hydrocarbon groups may be the same hydrocarbon group or different hydrocarbon groups. Further, the hydrocarbon group may contain a single bond like an alkyl group, or may contain an unsaturated bond such as a double bond or a triple bond. In addition, the amino group may have a cyclic structure. Since the amino group is bonded to Si, which is the central atom of the SiH$_3$(NR$_2$) molecule, this amino group will be referred to as a ligand or an amino ligand.

As the MAS gas, it may be possible to use, for example, an ethylmethylaminosilane (SiH$_3$[N(CH$_3$)(C$_2$H$_5$)]) gas, a dimethylaminosilane (SiH$_3$[N(CH$_3$)$_2$]) gas, a diisopropylaminosilane (SiH$_3$[N(C$_3$H$_7$)$_2$]) gas, a disecondarybutylaminosilane (SiH$_3$[H(C$_4$H$_9$)$_2$]) gas, a dimethylpiperidinosilane (SiH$_3$[NC$_5$H$_8$(CH$_3$)$_2$]) gas, or a diethylpiperidinosilane (SiH$_3$[NC$_5$G$_8$(C$_2$H$_5$)$_2$]) gas.

As the AS gas, it may be possible to use, in addition to the aforementioned MAS gas containing only one amino group in one molecule, a bisaminosilane (SiH$_2$(NR$_2$)$_2$, abbreviation: BAS) gas containing two amino groups in one molecule or a trisaminosilane (SiH(NR$_2$)$_3$, abbreviation: TAS) gas containing three amino groups in one molecule. Further, when two hydrocarbon groups constituting a portion of the amino group are coordinated to one N, the two hydrocarbon groups may be the same hydrocarbon group or different hydrocarbon groups. In addition, the hydrocarbon group may contain a single bond like an alkyl group, or may contain an unsaturated bond such as a double bond or a triple bond. Further, the amino group may have a cyclic structure.

In addition, as the AS gas, it may be possible to use an aminosilane compound represented by the following chemical formula [1]:

$$SiA_x[(NB_2)_{(4-x)}] \qquad [1].$$

In the formula [1], the symbol A represents a hydrogen atom, an alkyl group such as a methyl group, an ethyl group, a propyl group, and a butyl group, or an alkoxy group such as a methoxy group, an ethoxy group, a propoxy group, and a butoxy group. The alkyl group may be not only a linear alkyl group but also a branched alkyl group such as an isopropyl group, an isobutyl group, a secondary butyl group, a tertiary butyl group, and the like. The alkoxy group may be not only a linear alkoxy group but also a branched alkoxy group such as an isopropoxy group, an isobutoxy group, and the like. The symbol B represents a hydrogen atom or an alkyl group such as a methyl group, an ethyl group, a propyl group, or a butyl group. The alkyl group may be not only a linear alkyl group but also a branched alkyl group such as an isopropyl group, an isobutyl group, a secondary butyl group, a tertiary butyl group, and the like. A plurality of A's may be the same as or different from each other, and two B's may be the same as or different from each other. The symbol x is an integer of 1 to 3.

As the inert gas, it may be possible to use, in addition to the N$_2$ gas, a rare gas such as an argon (Ar) gas, a helium (He) gas, a neon (Ne) gas, or a xenon (Xe) gas. This also applies to each step as described below.

[Step A2]

At step A2, the surface of the wafer 200 is modified by supplying the F-containing gas to the wafer 200 to cause the F-containing gas to react with Si adsorbed on the surface of the base 200*a*, such that the surface of the wafer 200 is fluorine-terminated (F-terminated).

After step A1 is completed, the F-containing gas is supplied to the wafer 200 in the process chamber 201, that is, the wafer 200 after Si is selectively adsorbed on the surface of the base 200*a*.

Specifically, the valve 243*b* is opened to allow the F-containing gas to flow through the gas supply pipe 232*b*. A flow rate of the F-containing gas is regulated by the MFC 241*b*. The F-containing gas is supplied into the process chamber 201 via the nozzle 249*b* and is exhausted from the exhaust port 231*a*. At this time, the F-containing gas is supplied to the wafer 200 (F-containing gas supply).

At this time, the valves 243*d* and 243*f* may be opened to supply an inert gas into the process chamber 201 via the nozzles 249*a* and 249*c*. The supply of the inert gas may not be performed.

Processing conditions at this step may be exemplified as follows:

F-containing gas supply flow rate: 1 to 2,000 sccm, specifically 1 to 500 sccm in some embodiments F-containing gas supply time: 1 second to 60 minutes Processing temperature: room temperature to 550 degrees C., specifically room temperature to 450 degrees C. in some embodiments.

Other conditions may be similar to those of the processing conditions at step A1. The conditions described herein are conditions under which the surface of the base 200*a* is not etched, and are conditions under which the surface of the base 200*a* is modified (F-terminated), as will be described later.

By supplying the F-containing gas to the wafer 200 under the aforementioned conditions, the surface of the base 200*a* may be modified without being etched by causing Si adsorbed on the surface of the base 200*a* at step A1 to react with the F-containing gas.

The modified base 200*a* has a F-terminated (or SiF-terminated) surface. Further, when attention is paid to atoms existing on the outermost surface of the modified base 200*a*, it may be said that the base 200*a* has a F-terminated surface. In addition, when attention is paid to the atoms existing on the outermost surface of the modified base 200*a* and atoms bonded to the atoms, it may be said that the base 200*a* has a SiF-terminated surface. In the present disclosure, the former expression will be mainly used for the sake of convenience. As the surface of the base 200*a* is F-terminated, the film-forming reaction does not progress on the surface of the base 200*a* at step B as described below. Exactly, the time until the film-forming reaction occurs, that is, an incubation time, may be prolonged.

Further, in a case where organic components contained in the AS gas remain on the surface of the base 200*a*, when Si adsorbed on the surface of the base 200*a* reacts with the F-containing gas, the organic components are removed from the surface of the base 200*a*.

Figure 5C:
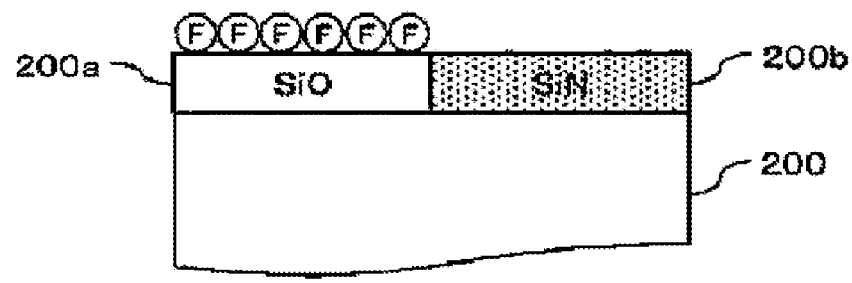
FIG. 5C is a partial enlarged cross-sectional view of the surface of the wafer 200 after the surface of the base 200a on which silicon is adsorbed is selectively modified by supplying a fluorine-containing gas.

As illustrated in FIG. 5C, at this step, the surface of the base 200*a* may be selectively (that is, preferentially) modified while suppressing the modification of the surface of the base 200*b*. At this time, a portion of the surface of the base 200*b* may be modified, but its modification amount becomes smaller than a modification amount of the surface of the base 200*a*.

Such selective (that is, preferential) modification is possible because Si is not adsorbed on many regions of the surface of the base 200*b* after performing step A1, whereas Si is adsorbed on the entire region of the surface of the base 200*a*. Since Si is not adsorbed on many regions of the surface of the base 200*b*, the reaction between Si and the F-containing gas does not progress, and as a result, the F termination is not formed in those many regions. However, as described above, Si may be adsorbed on some regions of the surface of the base 200*b*, and in that case, the F termination may be formed on the regions. On the other hand, on the entire region of the surface of the base 200*a*, Si adsorbed on the surface reacts with the F-containing gas to generate F-containing radicals, and a very stable F termination (that is, a SiF termination obtained by a reaction between Si and F) is formed on the entire region of the surface by an action of such radicals.

The F-containing radicals may include F, SiF, $SiF_2$, $SiF_3$, $SiH_2F$, $SiHF_2$, and the like.

Further, as described above, the amount of Si adsorbed on the surface of the base 200a at step A1 is set substantially uniform over the entire region of the surface of the base 200a. Therefore, at this step, the amount of the F-containing radicals generated on the surface of the base 200a becomes substantially uniform over the entire in-plane region of the surface. As a result, the modification of the base 200a described above progresses substantially uniformly over the entire region of the surface of the base 200a.

In addition, since Si is not adsorbed on many regions of the surface of the base 200b as described above, the reaction between Si and the F-containing gas does not progress and F-containing radicals are not generated, and therefore the regions are not modified. However, when Si is adsorbed on some regions of the surface of the base 200b, Si and the F-containing gas react with each other in the regions to generate the F-containing radicals, and the regions may be modified as described above. As a result, the surface of the base 200b is hardly damaged by etching, and adsorption sites are maintained in many regions of the surface.

After the surface of the base 200a out of the bases 200a and 200b is selectively modified, the valve 243b is closed to stop the supply of the F-containing gas into the process chamber 201. Then, the gas or the like, which remains within the process chamber 201, is removed from the interior of the process chamber 201 according to the same processing procedures as those of the purge at step A1.

As the F-containing gas, it may be possible to use a fluorine ($F_2$) gas, a chlorine trifluoride ($ClF_3$) gas, a $ClF_3$ gas+NO gas, a chlorine fluoride gas (ClF) gas, a $F_2$+nitric oxide (NO) gas, a ClF+NO gas, a nitrogen trifluoride ($NF_3$) gas, a tungsten hexafluoride ($WF_6$) gas, a nitrosyl fluoride (FNO) gas, or a mixture thereof.

[Step B]

At this step, a SiN film is selectively formed on the surface of the base 200b by supplying a precursor gas and a reaction gas as film-forming gases to the wafer 200 after performing step A. At step B, step B1 of supplying the precursor gas to the wafer 200 and step B2 of supplying the reaction gas to the wafer 200 are sequentially performed.

[Step B1]

At step B1, a precursor gas is supplied to the wafer 200 in the process chamber 201, that is the wafer 200 after the surface of the base 200a out of the bases 200a and 200b is selectively modified.

Specifically, the valve 243a is opened to allow a precursor gas to flow through the gas supply pipe 232a. A flow rate of the precursor gas is adjusted by the MFC 241a. The precursor gas is supplied into the process chamber 201 via the nozzle 249a and is exhausted from the exhaust port 231a. At this time, the precursor gas is supplied to the wafer 200 (precursor gas supply). Simultaneously, the valves 243e and 243f may be opened to supply the inert gas into the process chamber 201 via the nozzles 249b and 249c.

Processing conditions at this step may be exemplified as follows:

Precursor gas supply flow rate: 1 to 2,000 sccm, specifically 10 to 1,000 sccm in some embodiments Precursor gas supply time: 1 to 180 seconds, specifically 10 to 120 seconds in some embodiments Processing temperature: 350 to 600 degrees C., specifically 400 to 550 degrees C. in some embodiments Processing pressure: 1 to 2,000 Pa, specifically 10 to 1,333 Pa in some embodiments.

Other processing conditions may be similar to those of the processing conditions at step A1.

By supplying, for example, a chlorosilane-based gas, as the precursor gas to the wafer 200 under the aforementioned conditions, a Si-containing layer containing Cl is formed on the surface of the base 200b including an unmodified region out of the bases 200a and 200b. That is, a Si-containing layer containing Cl is formed, starting from an unmodified region of the base 200b, that is, a region in which the adsorption site is maintained. The Si-containing layer containing Cl is formed by physisorption or chemisorption of precursor to the surface of the base 200b, chemisorption of a substance ($Si_xCl_y$) obtained by a portion of precursor being decomposed, deposition of Si by pyrolysis of precursor, or the like. The Si-containing layer containing Cl may be an adsorption layer (a physical adsorption layer or a chemical adsorption layer) of precursor or $Si_xCl_y$, or may be a deposition layer of Si containing Cl. In the present disclosure, the Si-containing layer containing Cl will be simply referred to as a Si-containing layer.

At this step, the Si-containing layer can be selectively formed on the surface of the base 200b while suppressing the formation of the Si-containing layer on the surface of the base 200a. Further, when the surface of the base 200a is insufficiently modified due to certain factors, the Si-containing layer may be very slightly formed on the surface of the base 200a, but also in this case, a thickness of the Si-containing layer formed on the surface of the base 200a becomes much smaller than a thickness of the Si-containing layer formed on the surface of the base 200b. Such selective formation of the Si-containing layer is possible because the F termination existing on the surface of the base 200a acts as a factor that inhibits the formation of the Si-containing layer (adsorption of Si) on the surface of the base 200a, that is, as an inhibitor (an adsorption inhibitor or an adsorption suppressor). In addition, the F termination existing on the surface of the base 200a is stably maintained even when this step is performed.

After the Si-containing layer is formed on the surface of the base 200b, the valve 243a is closed to stop the supply of the precursor gas into the process chamber 201. Then, the gas or the like remaining within the process chamber 201 is removed from the interior of the process chamber 201 according to the same processing procedures as those of the purge at step A1 (purge).

As the precursor gas (film-forming gas), it may be possible to use a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like, a bromosilane-based gas such as a tetrabromosilane ($SiBr_4$) gas or the like, or an iodosilane-based gas such as a tetraiodosilane ($SiI_4$) gas or the like.

[Step B2]

At step B2, a reaction gas is supplied to the wafer 200 in the process chamber 201, namely the Si-containing layer formed on the base 200b.

Specifically, the valve 243c is opened to allow a reaction gas to flow through the gas supply pipe 232c. A flow rate of the reaction gas is adjusted by the MFC 241c. The reaction gas is supplied into the process chamber 201 via the nozzle 249c and is exhausted from the exhaust port 231a. At this time, the reaction gas is supplied to the wafer 200 (reaction gas supply). Simultaneously, the valves 243d and 243e may be opened to supply a $N_2$ gas into the process chamber 201 via the nozzles 249a and 249b, respectively.

Processing conditions at this step may be exemplified as follows:

Reaction gas supply flow rate: 10 to 10,000 sccm Reaction gas supply time: 1 to 60 seconds, specifically 5 to 50 seconds in some embodiments Processing pressure: 1 to 4,000 Pa, specifically 1 to 1,333 Pa in some embodiments.

Other processing conditions may be similar to those of the processing conditions of step A1.

By supplying, for example, a hydrogen-nitride gas, as the reaction gas to the wafer 200 under the aforementioned conditions, at least a portion of the Si-containing layer formed on the surface of the base 200b is nitrided. As the Si-containing layer is nitrided, a layer containing Si and N, that is, a silicon nitride layer (SiN layer) is formed on the surface of the base 200b. When forming the SiN layer, an impurity such as Cl or the like contained in the Si-containing layer constitutes a gaseous substance containing at least Cl in the process of nitriding the Si-containing layer with the reaction gas and is discharged from the interior of the process chamber 201. Thus, the SiN layer becomes a layer containing a smaller amount of impurity such as Cl or the like than the Si-containing layer formed at step B1. Further, the surface of the base 200a is maintained without being nitrided even when this step is performed. That is, the surface of the base 200a is stably maintained while being F-terminated without being nitirded (NH-terminated).

After the SiN layer is formed on the surface of the base 200b, the valve 243c is closed to stop the supply of the reaction gas into the process chamber 201. Then, the gas or the like remaining within the process chamber 201 is removed from the interior of the process chamber 201 according to the same processing procedures as those of the purge at step A1 (purge).

As the reaction gas (film-forming gas), it may be possible to use, for example, a hydrogen nitride-based gas such as an ammonia ($NH_3$) gas, a diazene ($N_2H_2$) gas, a hydrazine ($N_2H_4$) gas, a $N_3H_8$ gas or the like.

[Performing a Predetermined Number of Times]

Figure 5D:
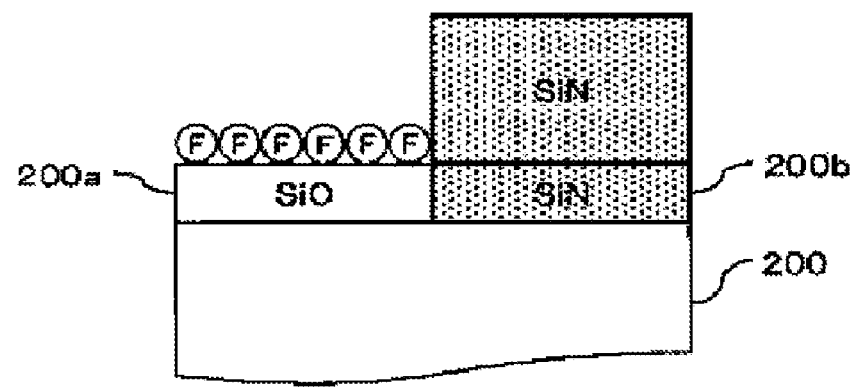
FIG. 5D is a partial enlarged cross-sectional view of the surface of the wafer 200 after a silicon nitride film is selectively formed on a surface of the base 200b for selective growth by supplying a film-forming gas.

A cycle which non-simultaneously, that is, non-synchronously, performs steps B1 and B2 described above is performed a predetermined number of times (m times, where m is an integer of 1 or more), whereby a SiN film can be selectively formed on the surface of the base 200b out of the bases 200a and 200b exposed on the surface of the wafer 200, as illustrated in FIG. 5D. The aforementioned cycle may be performed multiple times in some embodiments. That is, the thickness of the SiN layer formed per one cycle may be set smaller than a desired thickness, and the aforementioned cycle may be performed multiple times until the thickness of the film formed by laminating the SiN layer becomes equal to the desired thickness in some embodiments.

Further, when performing steps B1 and B2, since the F termination existing on the surface of the base 200a is stably maintained, no SiN film is formed on the surface of the base 200a. However, when the modification of the surface of the base 200a is not sufficient due to certain factors, the SiN film may be very slightly formed on the surface of the base 200a but even in this case, the thickness of the SiN film formed on the surface of the base 200a becomes much smaller than the thickness of the SiN film formed on the surface of the base 200b. In the present disclosure, the expression "a SiN film is selectively formed on the surface of the base 200b" out of the bases 200a and 200b may include not only a case where no SiN film is formed on the surface of the base 200a, but also a case where a very thin SiN film is formed on the surface of the base 200a, as described above.

[Step C]

At this step, after step B is performed, the SiN film formed on the surface of the base 200a is etched to expose the surface of the base 200a and the surface of the base 200a is remodified by supplying a F-containing gas to the wafer 200 after the SiN film is formed on the surface of the base 200a.

After step B is performed, the following two cases may be considered as cases where the SiN film is formed on the surface of the base 200a. As described above, one case is a case where a very thin SiN film is formed on the surface of the base 200a at step B. The other case is a case where selective breakage occurs to form the SiN film on the surface of the base 200a by continuing step B. For example, the cycle which performs steps B1 and B2 may be performed a plurality of times to cause desorption of at least a portion of the inhibitor, that is, the F termination formed on the surface of the base 200a, such that selective breakage may occur to form the SiN film on the surface of the base 200.

Figure 5E:
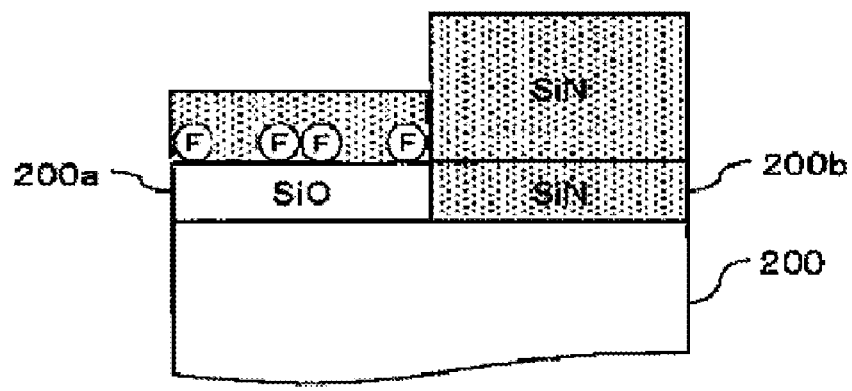
FIG. 5E is a partial enlarged cross-sectional view of the surface of the wafer 200 after the silicon nitride film is also formed on the surface of the base 200a by continuing the selective growth of the silicon nitride film to cause selective breakage to occur.

FIG. 5E illustrates a state in which a portion of the F termination as the inhibitor formed on the surface of the base 200a is desorbed while a portion of the F termination remains by continuing step B, and the SiN film is formed on the surface of the base 200a starting from a portion on which the adsorption site is exposed (that is, selective breakage occurs) by the desorption of the portion of the F termination.

As illustrated in FIG. 5E, after the selective breakage may occur to form the SiN film on the surface of the base 200a, the F-containing gas is supplied to the wafer 200 after the SiN film is formed on the surface of the base 200a.

Specifically, opening/closing control of the valves 243b, 243d and 243f is performed in the same procedure as the opening/closing control of the valves 243b, 243d and 243f at step A2. A flow rate of the F-containing gas is controlled by the MFC 241b. The F-containing gas is supplied into the process chamber 201 via the nozzle 249b and is exhausted from the exhaust port 231a. At this time, the F-containing gas is supplied to the wafer 200 (F-containing gas supply). The supply of the inert gas into the process chamber 201 is performed in the same manner as at step A2. The supply of the inert gas may not be performed, as at step A2.

Processing conditions at this step may be exemplified as follows:

F-containing gas supply flow rate: 1 to 2,000 sccm, specifically 1 to 500 sccm in some embodiments F-containing gas supply time: 5 to 60 minutes Processing temperature: room temperature to 550 degrees C., specifically room temperature to 450 degrees C. in some embodiments.

Other conditions may be similar to those of the processing conditions of step A1. The conditions described herein are conditions under which the SiN film formed on the surface of the base 200a can be etched, the surface of the base 200a is not etched, and the surface of the base 200a is modified (F-terminated).

By supplying the F-containing gas to the wafer 200 under the aforementioned conditions, the SiN film formed the surface of the base 200a at step B can be etched to expose the surface of the base 200a and the surface of the base 200a can be remodified.

Figure 5F:
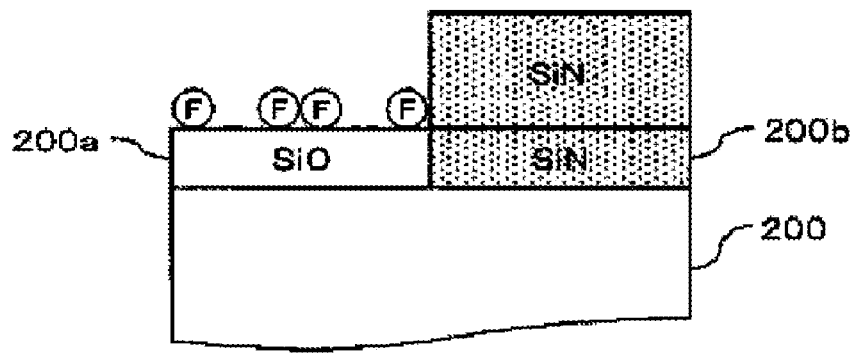
FIG. 5F is a partial enlarged cross-sectional view of the surface of the wafer 200 after the silicon nitride film formed on the surface of the base 200a is etched to expose the surface of the base 200a by supplying a fluorine-containing gas to the wafer 200 illustrated in FIG. 5E.

Specifically, the SiN film formed on the surface of the base 200a is etched by supplying the F-containing gas to the wafer 200 in the state of FIG. 5E. In addition, the etching of the SiN film progresses from the outermost surface of the SiN film toward an interface between the SiN film and the base 200a. The etching of the SiN film can progress by continuing the supply of the F-containing gas to the wafer 200 to remove the SiN film formed on the surface of the base 200a to expose the surface of the base 200a, as illustrated in FIG. 5F. Specifically, a surface of a portion of the surface of the base 200a from which the F termination as the inhibitor is desorbed can be exposed. In addition, a surface of a portion of the surface of the base 200a in which the F termination as the inhibitor is maintained without being desorbed is maintained while being F-terminated.

Figure 5G:
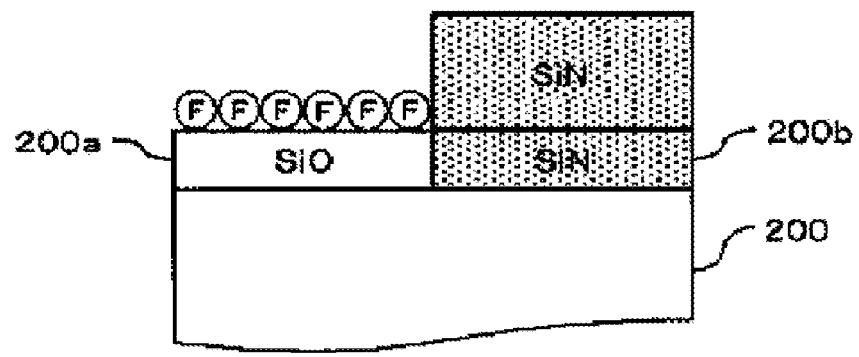
FIG. 5G is a partial enlarged cross-sectional view of the surface of the wafer 200 after the surface of the base 200a is remodified by supplying a fluorine-containing gas to the wafer 200 illustrated in FIG. 5F.

Even after the surface of the base 200a is exposed by etching the SiN film formed on the surface of the base 200a, the F-containing radicals are generated by further continuing the supply of the F-containing gas, and the surface of the base 200a can be remodified by the action of the radicals, as illustrated in FIG. 5G. That is, the surface of the base 200a can be remodified to be F-terminated. Specifically, the surface of the portion of the surface of the base 200a from which the F termination as the inhibitor is desorbed can be modified to be F-terminated again. In addition, the surface of the portion of the surface of the base 200a in which the F termination as the inhibitor is maintained without being desorbed is maintained while being F-terminated.

At step C, both the etching of the SiN film and the remodification of the surface of the base 200a can be performed under the same processing conditions by using the F-containing gas, that is, by using one type of gas. That is, two processes such as the etching of the SiN film and the remodification of the surface of the base 200a may be performed at one step. Thus, it is possible to shorten a processing time and to improve a productivity. Further, although there have been described above examples in which the remodification of the surface of the base 200a is performed after performing the etching of the SiN film, the surface of the base 200a may be modified to be F-terminated when the SiN film is desorbed from the surface of the base 200a, and a period during which the etching of the SiN film and the remodification of the surface of the base 200a are performed in parallel may be provided, depending on the processing conditions. By doing so, it is possible to further shorten the processing time and to further improve the productivity.

In addition, at step C, a portion of the SiN film formed on the surface of the base 200b is also etched when supplying the F-containing gas to the wafer 200. That is, the thickness of the SiN film formed on the surface of the base 200b after performing step C becomes smaller than the thickness of the SiN film formed on the surface of the base 200b after performing step B.

After the remodification of the base 200a is performed, the valve 243b is closed to stop the supply of the F-containing gas into the process chamber 201. Then, the gas or the like remaining within the process chamber 201 is removed from the process chamber 201 according to the same processing procedures as those of the purge at step A.

As the F-containing gas, it may be possible to use a gas similar to the F-containing gas used at step A2.

[Step D]

At this step, a SiN film is selectively formed on the SiN film formed on the surface of the base 200b by supplying a precursor gas and a reaction gas as a film-forming gas to the wafer 200 after performing step C. At step D, step D1 of supplying the precursor gas to the wafer 200 and step D2 of supplying the reaction gas to the wafer 200 are sequentially performed.

[Step D1]

At this step, the precursor gas is supplied to the wafer 200 in the process chamber 201, that is, the wafer 200 after remodifying the surface of the base 200a. The processing procedures and processing conditions at step D1 may be similar to the processing procedures and processing conditions at step B1.

By supplying, for example, a chlorosilane-based gas as the precursor gas to the wafer 200 in this way, a Si-containing layer is selectively formed on the SiN film formed on the surface of the base 200b. Specifically, the Si-containing layer is selectively formed on the SiN film which is formed on the surface of the base 200b at step B and a portion of which is etched at step C, that is, on the SiN film remaining without being etched at step C.

At this step, the Si-containing layer may be selectively formed on the SiN film formed on the surface of the base 200b while suppressing formation of the Si-containing layer on the surface of the base 200a. In addition, for example, when the remodificaiton of the surface of the base 200a is not sufficient due to certain factors, a very small Si-containing layer may be formed on the surface of the base 200a, as at step B1.

After the Si-containing layer is formed on the SiN film formed on the surface of the base 200b, the supply of the precursor gas into the process chamber 201 is stopped. Then, the gas or the like remaining within the process chamber 201 is removed from the interior of the process chamber 201 according to the same processing procedures as those of the purge at step A1.

As the precursor gas (film-forming gas), it may be possible to use a gas similar to the precursor gas used at step B1.

[Step D2]

At this step, a reaction gas is supplied to the wafer 200 in the process chamber 201, that is, the Si-containing layer formed on the SiN film on the surface of the base 200b. The processing procedures and processing conditions at step D2 may be similar to the processing procedures and processing conditions at step B2.

By supplying, for example, a hydrogen nitride-based gas as the reaction gas to the wafer 200 in this way, at least a portion of the Si-containing layer formed on the SiN film on the surface of the base 200b is nitrided. Thus, a layer containing Si and N, that is, a SiN layer, is formed on the SiN film on the surface of the base 200b.

Further, the surface of the base 200a is stably maintained while being F-terminated without being nitrided (NH-terminated) even when this step is performed, as at step B2.

After the SiN layer is formed on the SiN film on the surface of the base 200b, the supply of the reaction gas into the process chamber 201 is stopped. Then, the gas or the like remaining within the process chamber 201 is removed from the interior of the process chamber 201 according to the same processing procedures as those of the purge at step A1.

As the reaction gas (film-forming gas), it may be possible to use a gas similar to the reaction gas used at step B2.

[Performing a Predetermined Number of Times]

Figure 5H:
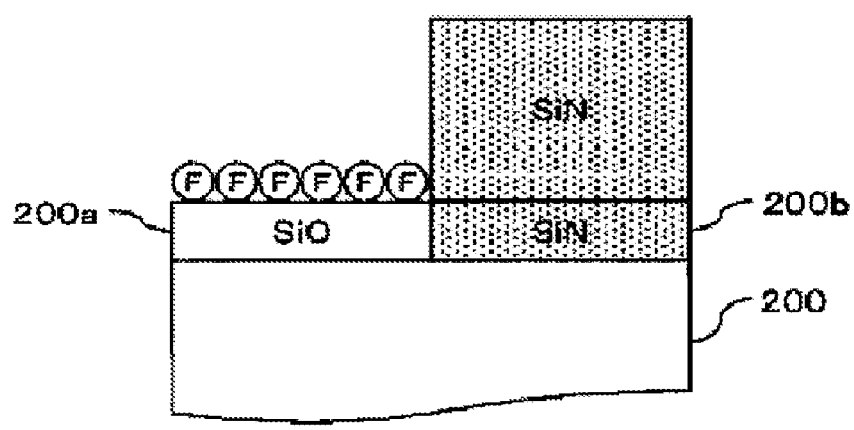
FIG. 5H is a partial enlarged cross-sectional view of the surface of the wafer 200 after a silicon nitride film is selectively formed on the silicon nitride film formed on the surface of the base 200b by supplying a film-forming gas to the wafer 200 illustrated in FIG. 5G.
Figure 5I:
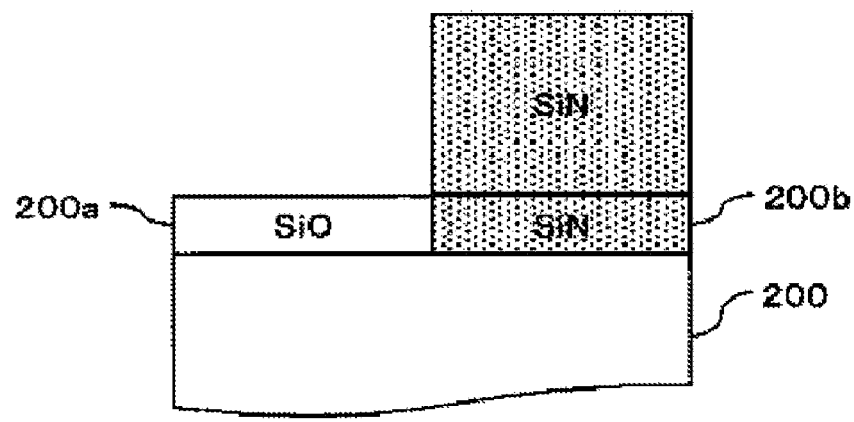
FIG. 5I is a partial enlarged cross-sectional view of the surface of the wafer 200 after the wafer 200 illustrated in FIG. 5H is exposed to an atmosphere.

A cycle which non-simultaneously, that is, non-synchronously, performs steps D1 and D2 described above is performed a predetermined number of times (n times, where n is an integer of 1 or more), whereby a SiN film can be selectively formed on the SiN film formed on the surface of the base 200b out of the bases 200a and 200b exposed on the surface of the wafer 200, as illustrated in FIG. 5H. The aforementioned cycle may be performed multiple times as at step B, in some embodiments.

Further, since the F termination existing on the surface of the base 200a is maintained when performing steps D1 and D2, the SiN film is not formed on the surface of the base 200a. However, for example, when the remodificaiton of the surface of the base 200a is not sufficient due to certain factors, the SiN film may be very slightly formed on the surface of the base 200a, as at step B.

(After-Purge and Returning to Atmospheric Pressure)

After the selective formation of the SiN film on the base 200b is completed, the inert gas as the purge gas is supplied from each of the nozzles 249a to 249c into the process chamber 201 and is exhausted from the exhaust port 231a. Thus, the interior of the process chamber 201 is purged and the gas or the reaction byproduct remaining within the process chamber 201 is removed from the interior of the process chamber 201 (after-purge). Thereafter, the internal atmosphere of the process chamber 201 is substituted by the inert gas (inert gas substitution), and the internal pressure of the process chamber 201 is returned to an atmospheric pressure (returning to atmospheric pressure return).

(Boat Unloading and Wafer Discharging)

After the internal pressure of the process chamber 201 is returned to the atmospheric pressure, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved such that the lower end opening of the manifold 209 is sealed by the shutter 219s via the O-ring 220c (shutter closing). The processed wafers 200 are unloaded to the outside of the reaction tube 203, and are subsequently discharged from the boat 217 (wafer discharging).

Further, as illustrated in FIG. SI, the F termination existing on the surface of the base 200a is eliminated by being brought into contact with and reacting with a predetermined substance (reactant) reacting with F, specifically, moisture (H$_2$O) in the air, to react with each other, when the processed wafers 200 are exposed to the air. That is, the F termination existing on the surface of the base 200a can be removed by the exposure of the processed wafers 200 to the air. In other words, the exposure of the processed wafers 200 to the air also serves as a step of eliminating the F termination formed on the surface of the base 200a (step E). By removing the F termination from the surface of the base 200a, the surface state of the base 200a is reset, and the film-forming process may progress on the surface of the base 200a at subsequent steps.

(3) Effects According to the Embodiments

According to the embodiments of the present disclosure, one or more effects as set forth below may be achieved.

By performing steps A to D, it becomes possible to selectively form the SiN film on the surface of the base 200b out of the bases 200a and 200b exposed on the surface of the wafer 200. This makes it possible to simplify processes, for example, omit a patterning process including photolithography when manufacturing a semiconductor device. As a result, it becomes possible to improve the productivity of the semiconductor device and to reduce a manufacturing cost.

At step A1, an amount of Si to be selectively (that is, preferentially) adsorbed on the base 200a can be set to be substantially uniform over the entire region of the surface of the base 200a. This makes it possible to substantially uniformly modify the entire region of the surface of the base 200a at the whole step A. As a result, it becomes possible to substantially uniformly inhibit the formation of the SiN film on the base 200a over the entire region of the surface of the base 200a at the subsequent step B. That is, it is possible to enhance a selectivity in selective growth.

At step C, since the etching of the SiN film formed on the surface of the base 200a and the remodification of the surface of the base 200a can be performed under the same processing conditions and thus the processing conditions may not be changed according to two different processes at step C, it is possible to shorten the processing time and to improve the productivity. Further, at step C, the etching of the SiN film and the remodification of the surface of the base 200a may be performed under different processing conditions, but the etching and the remodification may be performed under the same processing conditions in some embodiments, which may improve the productivity.

At step C, since the etching of the SiN film formed on the surface of the base 200a and the remodification of the surface of the base 200a can be performed at one step and thus these two different processes need not be performed separately at two different steps, it is possible to shorten the processing time and to improve the productivity.

In addition, depending on the processing conditions, when the SiN film is desorbed from the surface of the base 200a, the surface of the base 200a may be modified to be F-terminated while desorbing the SiN film from the surface of the base 200a, and thus a period during which the etching of the SiN film and the remodification of the surface of the base 200a are performed in parallel may be provided. By doing so, it is possible to further shorten the processing time and to further improve the productivity.

At step C, by performing the etching of the SiN film formed on the surface of the base 200a and the remodification of the surface of the base 200a under processing conditions where the surface of the base 200a is not etched, it is possible to suppress etching of the surface of the base 200a, to shorten the processing time, and to improve the productivity. Further, it is also possible to suppress consumption of the base 200a and etching damage to the surface of the base 200a. Further, the etching of the surface of the base 200a may be permitted as long as the semiconductor device finally obtained does not cause a problem, but the etching of the surface of the base 200a may be suppressed in terms of the aforementioned points.

At step C, by using the F-containing gas having the same molecular structure as that of the F-containing gas used at step A, it is possible to simplify (share) a gas supply system and to significantly reduce a device cost.

After step D is performed, it is possible to eliminate the F termination as the inhibitor existing on the surface of the base 200a by exposing the processed wafer 200 to the air. That is, the exposure of the processed wafer 200 to the air also serves as the step of eliminating the F termination (step E). In this manner, since the F termination can be easily removed, a separate step of removing the inhibitor may not be provided, and thus it is possible to simplify the manufacturing process of the semiconductor device, improve the productivity of the semiconductor device, and reduce the manufacturing cost.

By performing at least one selected from the group of steps A to D, specifically each of steps A to D in some embodiments, in a non-plasma atmosphere, it is possible to avoid plasma damage to the wafer 200, which may be applied to a step where the plasma damage is concerned about in the present disclosure.

Other Embodiments of the Present Disclosure

While the embodiments of the present disclosure have been specifically described above, the present disclosure is not limited to the aforementioned embodiments but may be variously modified without departing from the spirit of the present disclosure.

For example, as in the processing sequence illustrated in FIG. 6, instead of step A, step A' of modifying a surface of a base 200a exposed on a surface of a wafer 200 by supplying a hydrocarbon group-containing gas as a modifying gas to the wafer 200 including the base 200a and a base 200b exposed on the surface of the wafer 200 may be performed. In this case, the surface of the base 200a is not F-terminated as at step A, but is modified to be terminated with a hydrocarbon group. That is, at step A', the hydrocarbon group (termination of the hydrocarbon group) is used as the inhibitor.

As the hydrocarbon group-containing gas, it may be possible to use, for example, a gas containing an alkyl group. As the gas containing the alkyl group, it may be possible to use, for example, a gas containing an alkylsilyl group in which an alkyl group is coordinated to Si, that is, an alkylsilane-based gas. The alkyl group is a generic term for the remaining atomic group obtained by removing one hydrogen (H) atom from alkane (a chain saturated hydrocarbon represented by a chemical formula $C_nH_{2n+2}$), and is a functional group represented by a chemical formula $C_nH_{2n+1}$. The alkyl group includes a methyl group, an ethyl group, a propyl group, a butyl group, and the like. As the alkyl group is bonded to Si which is the central atom of the alkylsilane molecule, the alkyl group in alkylsilane may be referred to as a ligand or an alkyl ligand.

The hydrocarbon group-containing gas may further contain an amino group. That is, a hydrocarbon group- and an amino group-containing gas may be used as the modifying gas. For example, an alkylaminosilane-based gas (hereinafter, referred to as an "AAS gas") may be used as the hydrocarbon group- and the amino group-containing gas.

The AAS gas is a type of aminosilane-based gas and may be supplied from the aminosilane-based gas supply system described above.

Hereinafter, step A' will be described in detail.

At this step, an AAS gas is supplied to the wafer 200 in the process chamber 201, that is, the wafer 200 including the base 200a and the base 200b are exposed on its surface.

Specifically, the opening/closing control of the valves 243g, 243d and 243e is performed in the same procedure as the opening/closing control of the valves 243g, 243d and 243e at step A1. A flow rate of the AAS gas is adjusted by the MFC 241g. The AAS gas is supplied into the process chamber 201 via the nozzle 249c and is exhausted from the exhaust port 231a. At this time, the AAS gas is supplied to the wafer 200 (AAS gas supply). The supply of an inert gas into the process chamber 201 is performed in the same manner as at step A1. The supply of the inert gas may not be performed, as at step A1.

Processing conditions at this step may be exemplified as follows:

AAS gas supply flow rate: 1 to 3,000 sccm, specifically 1 to 500 sccm in some embodiments AAS gas supply time: 1 second to 120 minutes, specifically 30 seconds to 60 minutes in some embodiments Inert gas supply flow rate (per gas supply pipe): 0 to 20,000 sccm Processing temperature: room temperature (25 degrees C.) to 500 degrees C., specifically room temperature to 250 degrees C. in some embodiments Processing pressure: 5 to 1,000 Pa.

By supplying, for example, a methylaminosilane-based gas as the AAS gas to the wafer 200 under the aforementioned conditions, the surface of the base 200a out of the bases 200a and 200b can be selectively (that is, preferentially) modified. Specifically, an OH group terminating the surface of the base 200a may react with the AAS gas while suppressing the adsorption of Si contained in the AAS on the surface of the base 200b, to cause Si contained in the AAS to be adsorbed on the surface of the base 200a selectively (that is, preferentially). Thus, the surface of the base 200a may be terminated with an alkyl group such as a methyl group (Me) contained in AAS. Specifically, for example, the surface of the base 200a may be terminated with a trialkylsilyl group such as a trimethylsilyl group (Si-Me$_3$) contained in AAS. A methyl group (trimethylsilyl group) terminating the surface of the base 200a prevents the adsorption of the precursor gas to the surface of the base 200a and acts as an inhibitor that inhibits the progress of the film-forming reaction on the surface of the base 200a in selective growth.

Further, at this step, Si contained in the AAS gas is adsorbed on a portion of the surface of the base 200b and the portion of the surface of the base 200b may be terminated with a methyl group but its termination amount is small, and a termination amount of the surface of the base 200a with the methyl group becomes overwhelmingly larger. Such selective (that is, preferential) termination becomes possible because the processing conditions at this step are set to conditions under which the AAS gas is not gas-phase decomposed in the process chamber 201. Further, such selective termination becomes possible because the surface of the base 200a is OH-terminated over the entire region, whereas many regions of the surface of the base 200b are not OH-terminated. At this step, since the AAS gas is not gas-phase decomposed in the process chamber 201, Si contained in AAS is not multiple-deposited on the surfaces of the bases 200a and 200b and Si contained in AAS is selectively adsorbed on the surface of the base 200a, thus selectively terminating the surface of the base 200a with the methyl group.

After the surface of the base 200a is modified, the valve 243g is closed to stop the supply of the AAS gas into the process chamber 201. Then, the gas or the like remaining within the process chamber 201 is removed from the process chamber 201 according to the same processing procedures as those of the purge at step A1.

As the hydrocarbon group-containing gas, it may be possible to use, for example, an alkylaminosilane-based gas such as a dimethylaminotrimethylsilane (($CH_3$)$_2$NSi($CH_3$)$_3$, abbreviation: DMATMS) gas containing an alkylsilyl group and an amino group. Si, which is the central atom of DMATMS, is bonded with three alkyl groups (methyl group, Me) and one amino group (dimethylamino group). That is, DMATMS contains three alkyl ligands and one amino ligand. As the hydrocarbon group-containing gas, it may be possible to use, in addition to the DMATMS gas, for example, the aminosilane compound represented by the chemical formula [1] described above.

Thereafter, selective growth similar to that of the aforementioned embodiments may be performed by performing each processing including steps B to D in the aforementioned embodiments.

Further, at step C of the aforementioned embodiments, there have been described examples where a portion of the surface of the base 200a from which the F termination as the inhibitor is desorbed is remodified to be F-terminated, and a portion of the surface of the base 200a from which the F termination as the inhibitor is not desorbed is maintained as it is.

On the other hand, as in the aforementioned embodiments, at step C, a portion of the surface of the base 200a from which the hydrocarbon group termination as the inhibitor is desorbed is modified to be F-terminated, but a portion of the surface of the base 200a from which the hydrocarbon group termination as the inhibitor is not desorbed is not maintained as it is and such a portion may also be modified to be F-terminated. This is because the hydrocarbon group not desorbed from the surface of the base 200a is bonded to Si adsorbed on the surface of the base 200a and this Si and the F-containing gas can react with each other to F-terminate the portion. That is, in the present embodiment, at step A', the surface of the base 200a is modified to be terminated with the hydrocarbon group, and at step C, the surface of the base 200a is modified to F-terminate the surface of the base 200a when remodifying the surface of the base 200a. In other words, in the present embodiment, a component of the inhibitor formed on the surface of the base 200a at step A' becomes different from a component of the inhibitor formed on the surface of the base 200a at step C.

Even in the present embodiment, the same effects as those of the aforementioned embodiments may be achieved. In addition, in the present embodiment, the processing time at step A' may be shorter than the processing time at step A, thereby further improving the productivity.

Further, for example, in the aforementioned embodiments, there have been described examples in which steps C and D are each performed once, but steps C and D may be performed a plurality of times. The number of performing steps C and D may be appropriately set according to a thickness of a film to be selectively grown.

Further, for example, in the aforementioned embodiments, there have been described examples in which the F termination existing on the surface of the base 200a is removed by the exposure of the processed wafer 200 to the air, but the F termination existing on the surface of the base 200a may be removed by supplying a $H_2O$ gas to the wafer 200 in the process chamber 201 to bring the $H_2O$ gas into contact with the surface of the wafer 200, for example, after step D is completed.

Further, for example, in addition to the base 200a including the SiO film and the base 200b including the SiN film, a base including a semiconductor thin film such as a Si film, a germanium film (Ge film), and a silicon germanium film (SiGe film), or a base including a conductive metal thin film such as a tungsten film (W film), a tungsten nitride film (WN film), and a titanium nitride film (TiN film) may be exposed on the surface of the wafer 200. Further, instead of the base 200b including the SiN film, the base including the semiconductor thin film or the metal thin film described above may be exposed. Even in these cases, the same effects as those of the aforementioned embodiments may be achieved. That is, a film may be selectively formed on the surface of the SiN film or on the surface of the semiconductor thin film or the metal thin film described above while avoiding the film formation on the SiO film.

Further, for example, at step A1, a MAS gas, a BAS gas and a TAS gas may be used as the AS gas, and even in this case, the same effects as those of the aforementioned embodiments may be achieved. However, at step A1, as the number of amino groups contained in one molecule in a gas used as the AS gas becomes smaller, an adsorption density of Si on the surface of the base 200a becomes higher, and a density of SiF termination formed on the surface of the base 200a becomes higher at step A. As a result, it is possible to enhance the film-forming inhibition effect on the surface of the base 200a at step B. In this regard, a MAS gas in which one amino group is contained in one molecule may be used as the AS gas in some embodiments.

In addition, for example, at step B, before starting the cycle which non-simultaneously performs steps B1 and B2, a step (reaction gas preflow) of supplying, for a predetermined period of time, a reaction gas to the wafer 200 in the process chamber 201, that is, the wafer 200 after the surface of the base 200a out of the base 200a and the base 200b is selectively modified, may be performed. Even in this case, since the F termination or the hydrocarbon group termination existing on the surface of the base 200a is stably maintained, the same effects as those of the aforementioned embodiments may be achieved. Furthermore, since the adsorption site on the surface of the base 200b may be optimized, it is possible to improve a quality of the SiN film formed on the base 200b.

Further, for example, at step D, before starting the cycle which non-simultaneously performs steps D1 and D2, a step (reaction gas preflow) of supplying, for a predetermined period of time, a reaction gas to the wafer 200 in the process chamber 201, that is, the wafer 200 after the surface of the base 200a out of the base 200a and the base 200b is selectively remodified, may be performed. Even in this case, since the F termination existing on the surface of the base 200a is stably maintained, the same effects as those of the aforementioned embodiments may be achieved. Furthermore, since the adsorption site on the surface of the SiN film formed (remaining unetched) on the surface of the base 200b may be optimized, it is possible to improve a quality of the SiN film formed on the SiN film formed (remaining unetched) on the base 200b.

Further, for example, at step B or D, the chlorosilane-based gas described above, a silicon hydride gas such as a disilane ($Si_2H_6$) gas, or a halogenated metal gas such as a titanium tetrachloride ($TiCl_4$) gas may be used as the precursor gas. Further, in addition to the N-containing gas such as a $NH_3$ gas, for example, an O-containing gas such as an oxygen ($O_2$) gas, a N- and C-containing gas such as a triethylamine (($C_2H_5$)$_3$N, abbreviation: TEA) gas, a C-containing gas such as a propylene ($C_3H_6$) gas, or a boron (B)-containing gas such as a trichloroborane ($BCl_3$) gas may be used as the reaction gas.

By using these gases at step B or D, a film such as a Si film, a silicon oxynitride film (SiON film), a silicon carbonitride film (SiCN film), a silicon oxycarbonitride film (SiOCN film), a silicon oxycarbide film (SiOC film), a silicon boronitride film (SiBN film), a silicon borocarbonitride film (SiBCN film), a titanium nitride film (TiN film), and a titanium oxynitride film (TiON film) may be formed on the surface of the base 200b which is not modified out of the base 200a and the base 200b. As the F termination formed on the surface of the base 200a is very stable, in these cases, that is, when a gas containing an OH group such as water vapor (1420 gas) is not used as the film-forming gas, the same effects as those of the aforementioned embodiments may be achieved.

Further, for example, in the aforementioned embodiments, there have been described examples in which the first film formed at step B is the SiN film, and the second film formed at step D is the SiN film, that is, the same type of film is formed at steps B and D, but different types of films may be formed at steps B and D. For example, the first film may be the SiN film, the second film may be the SiO film or the SiON film, or the types of films described above may be appropriately combined.

Recipes used in each processing may be provided individually according to the processing contents and may be stored in the memory 121c via a telecommunication line or the external memory 123. Further, at the start of each processing, the CPU 121a may properly select an appropriate recipe from the recipes stored in the memory 121c according to the processing contents. Thus, it is possible for a single substrate processing apparatus to form films of various types, composition ratios, qualities, and thicknesses with enhanced reproducibility. In addition, it is possible to reduce an operator's burden and to quickly start each processing while avoiding an operation error.

The recipes mentioned above are not limited to newly-provided ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described examples in which selective growth is performed by using a batch-type substrate processing apparatus capable of processing a plurality of substrates at a time. The present disclosure is not limited to the aforementioned embodiments but may be appropriately applied to, for example, a case where selective growth is performed by using a single-wafer-type substrate processing apparatus capable of processing a single substrate or several substrates at a time. Further, in the aforementioned embodiments, there have been described examples in which selective growth is performed by using the substrate processing apparatus provided with a hot-wall-type process furnace. The present disclosure is not limited to the aforementioned embodiments but may be appropriately applied to a case where selective growth is performed by using a substrate processing apparatus provided with a cold-wall-type process furnace.

In the case of using these substrate processing apparatuses, each processing may be performed by processing sequences and processing conditions similar to those of the aforementioned embodiments. Effects similar to those of the aforementioned embodiments above may be achieved.

The embodiments described above may be appropriately combined with one another. The processing procedures and processing conditions in that case may be similar to, for example, the processing procedures and processing conditions of the aforementioned embodiments.

According to the present disclosure in some embodiments, it is possible to provide a technique capable of improving a productivity in selective growth.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) modifying a surface of a first base by supplying a modifying gas to the substrate including the first base and a second base on a surface of the substrate, the modifying gas including a silicon-containing gas and a first fluorine-containing gas;
   (b) forming a first film on a surface of the second base by supplying a first film-forming gas to the substrate after performing (a);
   (c) etching a first film formed on the surface of the first base- and remodifying the surface of the first base by supplying a second fluorine-containing gas to the substrate after the first film is formed on the surface of the first base after performing (b); and
   (d) forming a second film on the first film formed on the surface of the second base by supplying a second film-forming gas to the substrate after performing (c),
   wherein in (a), the silicon-containing gas is supplied before the first fluorine-containing gas is supplied.

2. The method according to claim 1, wherein in (c), the act of etching the first film and the act of remodifying the surface of the first base are performed under a same processing condition.

3. The method according to claim 1, wherein in (c), the act of etching the first film and the act of remodifying the surface of the first base are performed under a processing condition in which the surface of the first base is not etched.

4. The method according to claim 1, wherein (c) includes modifying the surface of the first base to be fluorine-terminated.

5. The method according to claim 1, wherein (a) includes modifying the surface of the first base to be fluorine-terminated.

6. The method according to claim 1, wherein (a) includes:
   (a1) causing silicon contained in the silicon-containing gas to be adsorbed on the surface of the first base by supplying the silicon-containing gas to the substrate; and
   (a2) modifying the surface of the first base to be fluorine-terminated by supplying the first fluorine-containing gas to the substrate to cause the first fluorine-containing gas to react with the silicon adsorbed on the surface of the first base.

7. The method according to claim 1, wherein the modifying vas further includes an alkyl group-containing gas, and wherein the alkyl group-containing gas is a hydrocarbon group- and an amino group-containing gas.

8. The method according to claim 7, wherein the alkyl group-containing gas is an alkylaminosilane-based gas.

9. The method according to claim 7, wherein (a) includes modifying the surface of the first base to be terminated with a hydrocarbon group.

10. The method according to claim 1, wherein the first base includes an oxygen-containing film, and the second base includes an oxygen-free film.

11. The method according to claim 1, wherein the first base includes an oxide film and the second base includes a nitride film.

12. The method according to claim 1, wherein the first base includes a film containing silicon and oxygen, and the second base includes a film containing silicon and nitrogen.

13. The method according to claim 1, wherein (a), (b), (c), and (d) are performed in a non-plasma atmosphere.

14. The method according to claim 1, wherein (c) includes modifying the surface of the first base to be fluorine-terminated, and wherein the method further comprises: (e) eliminating a fluorine termination formed on the surface of the first base by bringing a substance, which reacts with fluorine, into contact with the surface of the substrate after the first film and the second film are formed on the surface of the second base.

15. The method according to claim 14, wherein the substance, which reacts with the fluorine, contains moisture.

16. The method according to claim 14, wherein the substance, which reacts with the fluorine, contains $H_2O$.

17. A method of manufacturing a semiconductor device comprising the method of claim 1.

18. The method according to claim 1, wherein the silicon-containing gas is a silicon- and an amino group-containing gas.

19. The method according to claim 1, wherein the modifying vas further includes an alkyl group-containing gas, and wherein the alkyl group-containing gas contains silicon.

20. The method according to claim 1, wherein the modifying vas further includes an alkyl group-containing gas, and wherein the alkyl group-containing gas contains an amino group.

21. The method according to claim 1, wherein the modifying vas further includes an alkyl group-containing gas, and wherein the alkyl group-containing gas contains silicon and an amino group.

22. The method according to claim 1, wherein the modifying gas further includes a silicon- and hydrocarbon group-containing gas.

\* \* \* \* \*